(12) United States Patent
Bi et al.

(10) Patent No.: US 9,324,943 B2
(45) Date of Patent: Apr. 26, 2016

(54) FILAMENTARY MEMORY DEVICES AND METHODS

(71) Applicant: Micron Technology, Inc., Boise, ID (US)

(72) Inventors: Lei Bi, Boise, ID (US); Beth R. Cook, Meridian, ID (US); Marko Milojevic, Boise, ID (US); Durai Vishak Nirmal Ramaswamy, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/451,179

(22) Filed: Aug. 4, 2014

(65) Prior Publication Data

US 2014/0339491 A1 Nov. 20, 2014

Related U.S. Application Data

(63) Continuation of application No. 13/491,116, filed on Jun. 7, 2012, now Pat. No. 8,797,784.

(51) Int. Cl.
| | |
|---|---|
| *G11C 11/00* | (2006.01) |
| *H01L 45/00* | (2006.01) |
| *G11C 13/00* | (2006.01) |
| *H01L 27/24* | (2006.01) |

(52) U.S. Cl.
CPC ............ *H01L 45/08* (2013.01); *G11C 13/0002* (2013.01); *G11C 13/004* (2013.01); *G11C 13/0007* (2013.01); *G11C 13/0035* (2013.01); *G11C 13/0069* (2013.01); *H01L 27/2463* (2013.01); *H01L 45/145* (2013.01); *G11C 2013/0073* (2013.01); *G11C 2013/0083* (2013.01); *G11C 2213/35* (2013.01)

(58) Field of Classification Search
CPC ............ G11C 13/0007; G11C 13/0069; G11C 2013/0073; G11C 2013/0083; G11C 13/0002; G11C 13/0004; G11C 13/0035; G11C 13/004; G11C 2213/31; G11C 2213/35; G11C 11/5614; G11C 11/5685
See application file for complete search history.

(56) References Cited

U.S. PATENT DOCUMENTS

| | | | |
|---|---|---|---|
| 7,911,030 | B2 | 3/2011 | Chung |
| 8,797,784 | B2 | 8/2014 | Bi et al. |
| 2010/0163819 | A1 | 7/2010 | Hwang |
| 2010/0172170 | A1* | 7/2010 | Tamai ................ G11C 11/5614 365/148 |
| 2011/0044089 | A1 | 2/2011 | Goux et al. |
| 2011/0227026 | A1 | 9/2011 | Sekar et al. |
| 2013/0329483 | A1 | 12/2013 | Bi et al. |

OTHER PUBLICATIONS

Johnson, Colin, "Memristors Ready for Prime Time", EE Times, (Aug. 7, 2008), 3 pages.

\* cited by examiner

*Primary Examiner* — Thong Q Le
(74) *Attorney, Agent, or Firm* — Schwegman Lundberg & Woessner, P.A.

(57) ABSTRACT

Apparatus, devices, systems, and methods are described that include filamentary memory cells. Mechanisms to substantially remove the filaments in the devices are described, so that the logical state of a memory cell that includes the removable filament can be detected. Additional apparatus, systems, and methods are described.

20 Claims, 5 Drawing Sheets

FILAMENTARY MEMORY DEVICES AND METHODS

PRIORITY APPLICATION

This application is a continuation of U.S. application Ser. No. 13/491,116, filed Jun. 7, 2012, which is incorporated herein by reference in its entirety.

BACKGROUND

Some semiconductor devices operate as resistive random access memory devices (RRAM). Memory cells in these devices include a variable state material or materials whose state can be changed from a high resistance state to a low resistance state, and back again. RRAM devices are often non-volatile and can be formed in memory cells having a small form factor. One mechanism of changing state in RRAM devices includes forming and removing a conducting filament through an insulator material.

DETAILED DESCRIPTION

In the following detailed description of various embodiments of the invention, reference is made to the accompanying drawings that form a part hereof and in which are shown, by way of illustration, specific embodiments in which the invention may be practiced. These embodiments are described in sufficient detail to enable those of ordinary skill in the art to practice the invention. Other embodiments may be utilized and structural, logical, and electrical changes may be made.

The term "horizontal" as used in this application is defined as a plane parallel to the conventional plane or surface of a wafer or substrate, regardless of the orientation of the wafer or substrate. The term "vertical" refers to a direction perpendicular to the horizontal as defined above. Prepositions, such as "on," "side" (as in "sidewall"), "higher," "lower," "over," and "under" are defined with respect to the conventional plane or surface being on the top surface of the wafer or substrate, regardless of the orientation of the wafer or substrate.

Figure 1:
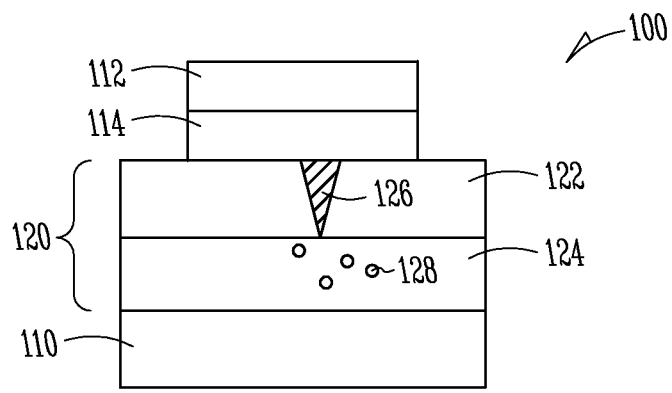
FIG. 1 shows a memory cell according to an embodiment of the invention.

FIG. 1 shows a memory cell 100 according to an embodiment of the invention. A pair of electrodes are illustrated, including a first electrode 110 and a second electrode 112. A reversible filament region 120 is located between the first electrode 110 and the second electrode 112. The reversible filament region 120 includes an insulator 122 that forms an interface with an oxygen source material 124.

The electrodes 110, 112 may be formed from any suitable conductor material. In one example, the first electrode 110 includes a metal. Examples of metals that are suitable for the first electrode 110 include, but are not limited to, platinum, ruthenium, iridium, or other non oxidizable metals. In one example, the second electrode 112 includes a metal. In one example the second electrode 112 is formed from platinum. Other examples of conductors that are suitable for the second electrode 112 include, but are not limited to, titanium nitride and tungsten nitride.

In one example, the insulator 122 includes an oxide material. In one example, the insulator 122 includes an oxide material chosen from one or more of the following example materials: $Al_2O_3$, $AlO_x$, $CoO$, $CoO_x$, $NiO$, $NiO_x$, $Fe_2O_3$, $Fe_3O_4$, $FeO_x$, $Cu_2O$, $CuO$, $CuO_x$, $Zn:FeO_x$, $HfO_2$, $HfO_x$, $HfSiO_x$, $SiO_x$, $TiO_2$, $TiO_x$, $MgO$, $MgO_x$, $MnO_2$, $MnO_x$, $Ti:NiO$, $TaO_x$, $Ta_2O_5$, $WO_2$, $WO_3$, $WO_x$, $ZnO$, $ZnO_x$, $ZrO_2$, $ZrO_x$, $ZrSiO_x$. In one example, the insulator 122 includes a stack of a combination of two or more materials, such as the example oxide materials above. In one example, the insulator 122 has a thickness between approximately 5 Å and 200 Å. In one example, the insulator 122 has a thickness between approximately 10 Å and 30 Å.

In one example, the oxygen source material 124 includes an oxygen-containing perovskite structure material. Examples of oxygen-containing perovskite structure materials include materials of the form: $ABO_3$, $ABO_{3-\delta}$, $ABO_{3+\delta}$, $A_2BO_4$, $A_{0.6}BO_3$, $A_{1-x}BO_3$, $A_{0.3}BO_3$ and $A_nB_nO_{3n+1}$, where A and B are transition metal ions. Other oxygen sources with high oxygen mobility and/or diffusivity can also be used as an oxygen source material 124. In one example, the oxygen source material 124 has a thickness between approximately 50 Å and 1000 Å. In one example, the oxygen source material 124 has a thickness of approximately 200 Å.

In operation, when a voltage that exceeds a formation threshold is applied across the first electrode 110 and the second electrode 112, a filament 126 is formed that creates a lower resistance pathway across the insulator 122 (i.e., the pathway formed across the insulator 122 has a lower resistance than the bulk material that forms the insulator 122). The filament 126 that has been formed remains in place in the memory cell 100 until a reversed voltage that exceeds a filament removal threshold is applied across the first electrode 110 and the second electrode 112.

When a reversed voltage that exceeds a filament removal threshold is applied, oxygen atoms 128 present in the oxygen source material 124 migrate from the oxygen source material 124 to the filament 126, and are used to remove the filament 126, returning the insulator 122 to its original resistance properties.

The presence or absence of a filament 126 is detected by measuring resistance through the memory cell 100. To provide data storage capability in a memory device that includes memory cells 100, a logical cell state, such as a "0" or a "1" can be assigned to a cell when a filament 126 is present in the cell, and a different logical cell state can be assigned to the cell when the filament 126 is absent.

Improved filament forming and removal mechanisms in memory devices can be useful. For example, it may be desirable to fully remove the filament 126 during memory device operations, because if the filament 126 is not substantially removed, the memory cell may only be able to return to an intermediate resistance after the memory cell 100 is first programmed from an initial high resistance state of an undisturbed insulator 122. In addition, it can be desirable to have a relatively large difference between the low resistance state (filament 126 formed) and the high resistance state (filament 126 absent/removed) to provide improved detectability of the logical state of the memory cell. Configurations of filamentary cells described in the present disclosure are able to completely remove the filament (completely reset the cell) so that the cell returns to its initial high resistance state.

In prior filamentary cell configurations, the formation of a filament 126 resulted in the sudden conduction of a large current through the memory cell 100, making the resulting filament 126 difficult to remove. In the memory cell 100 of FIG. 1, a resistor material 114 is located between the reversible filament region 120, and the second electrode 112. The resistor material 114 reduces the conduction of current through the memory cell 100 when the filament 126 is formed. The filament 126 formed in many embodiments of the invention is less damaging to the insulator 122, and moreover, can be substantially removed, when desired, to change the logical state of the memory cell 100. As noted above, substantial removal of the filament 126 is desirable to improve detectability of the logical state of the memory cell 100. Substantial removal of the filament 126 provides a number of additional desirable effects, including, but not limited to extended lifetime of the memory cell 100.

In one example, the resistor material 114 has a resistance between approximately 0.9 and 1.1 $\Omega$-cm. In one example, the resistor material 114 includes carbon. In one example, the resistor material 114 includes substantially amorphous carbon. In one example, the resistor material has a thickness between approximately 10 Å and 500 Å. In one example, the resistor material has a thickness between approximately 50 Å and 100 Å.

Figure 2:
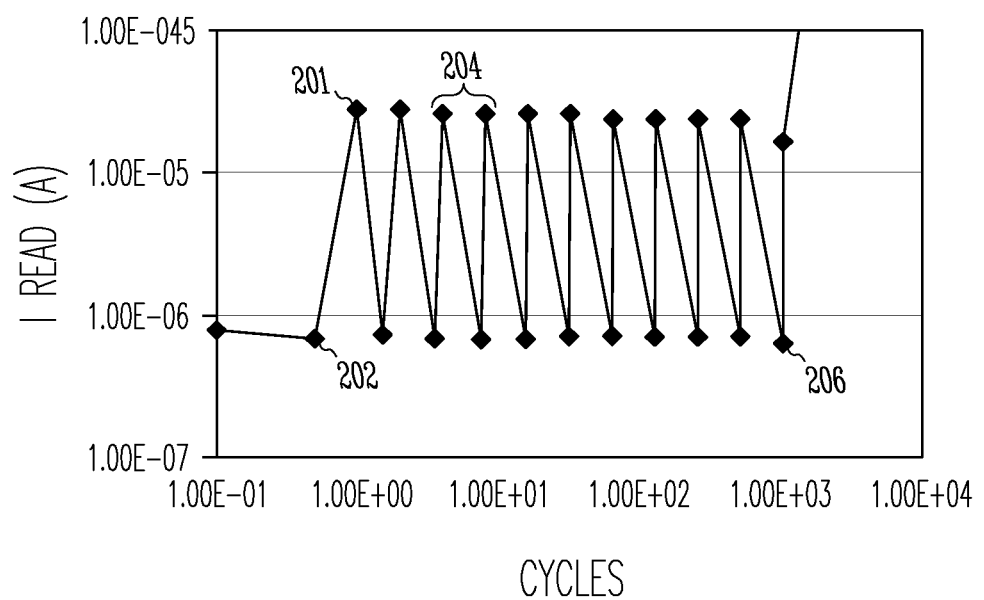
FIG. 2 shows a graph of electrical characteristics of a memory cell according to an embodiment of the invention.

FIG. 2 shows a graph of electrical characteristics of a memory cell according to an embodiment of the invention. Here the figure shows current on the Y-axis versus a number of formation cycles 204 on the X-axis. A voltage can be cycled a number of times as shown in FIG. 2 to program the memory cell. A low resistance state 201 indicates that a filament is being formed. In one example, three cycles of approximately 4.5 volts are used to form a filament. In one example, multiple cycles 204 are used to form the conducting filament.

After formation of the filament, the low resistance state of the memory cell can be read a number of times. In one example, filaments formed using the configurations and methods provided can be read for more than 1000 cycles without refreshing the memory cell.

Figure 3:
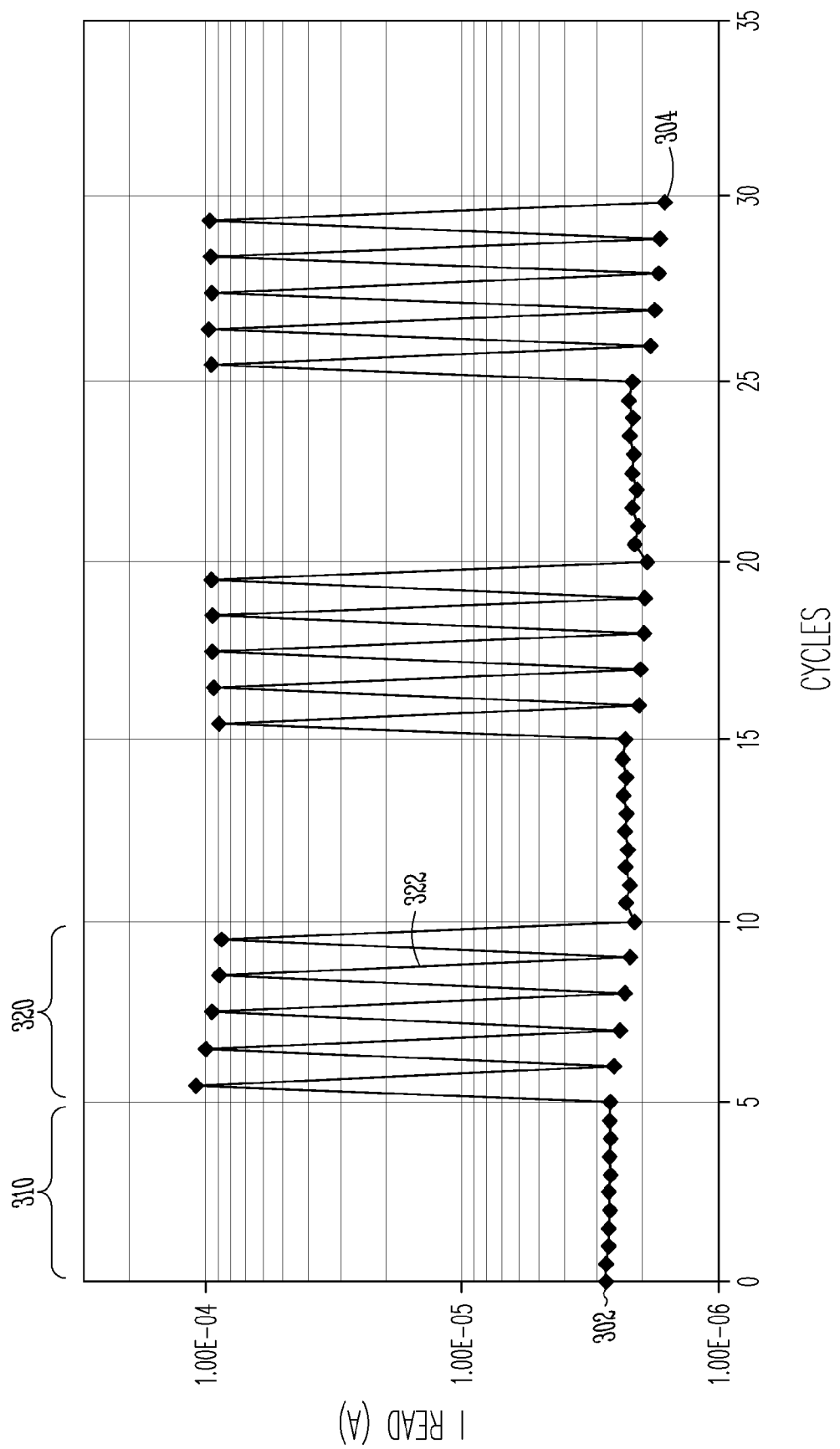
FIG. 3 shows another graph of electrical characteristics of a memory cell according to an embodiment of the invention.

FIG. 3 shows current on the Y-axis versus a number of cycles of a memory cell such as memory cell 100 from FIG. 1, on the X-axis. FIG. 3 shows a first region 310 of the graph with high resistance indicated by current level 302. In one example the first region 310 shows electrical performance of a memory cell where the filament has been removed.

Also shown is a second region 320 of low resistance. In one example the second region 320 shows electrical performance of a memory cell that includes a conducting filament. In the second region 320, cycles 322 shown low resistance across the electrodes of the memory cell.

As can be seen in FIG. 3, after a number of macro cycles between first regions 310 and second regions 320, the resulting state is associated with a current level 304 that indicates a resistance higher than the initial high resistance indicated by current level 302. This indicates that the filaments have been substantially removed when the state of the memory cell is switched between logical states.

In one example, a resistance across a reversible filament region after removal of a conducting filament is substantially the same as a resistance before forming the conducting filament. In one example, a resistance across a reversible filament region after removal of a conducting filament is greater than or equal to a resistance before forming the conducting filament. In one example, a resistance across a reversible filament region after removal of a conducting filament is greater than a resistance before forming the conducting filament.

Figure 4:
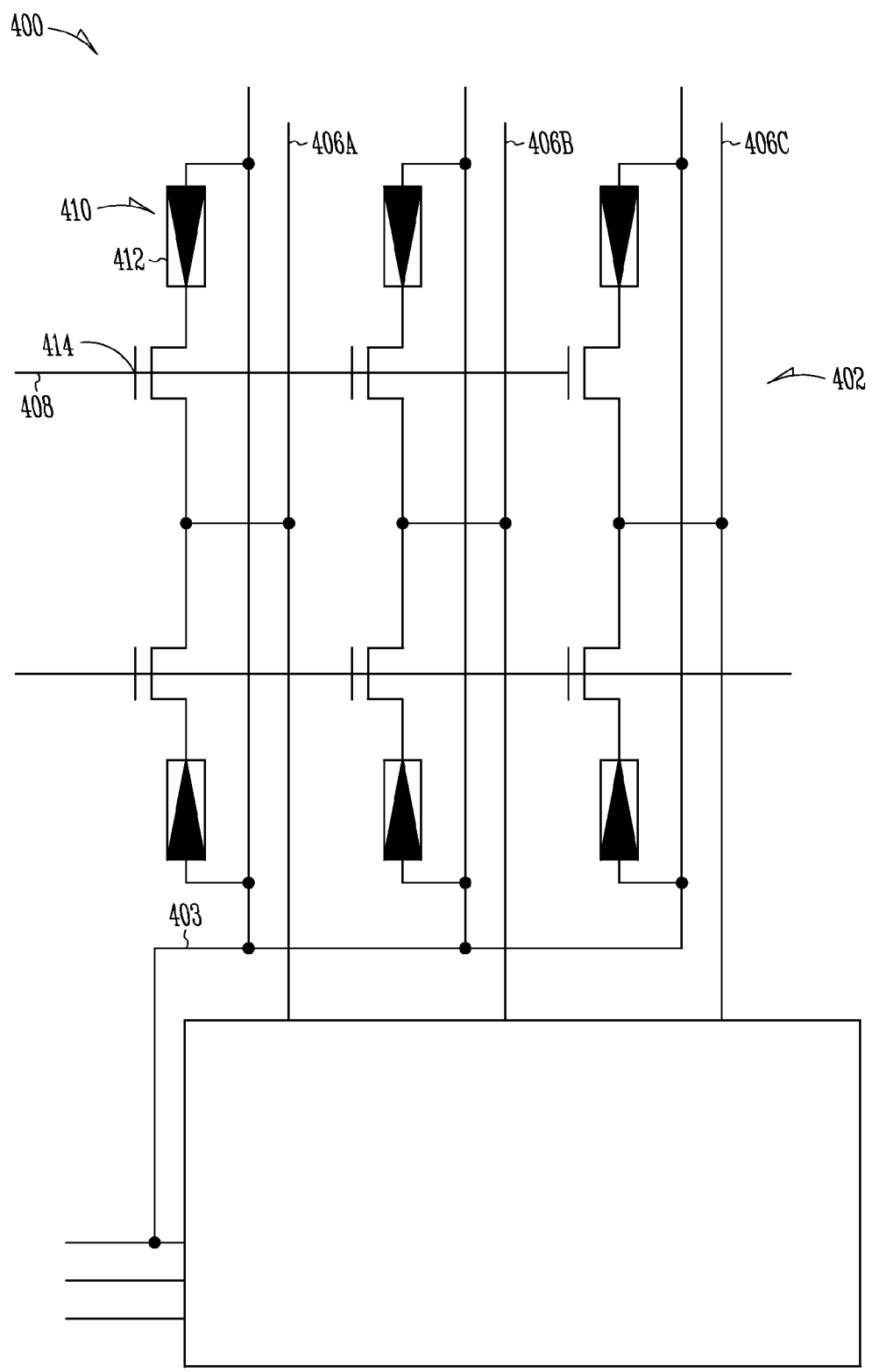
FIG. 4 shows a portion of a memory device according to an embodiment of the invention.

FIG. 4 illustrates a block diagram of one example of a memory device 400 according to an embodiment of the invention. The memory device 400 includes a number of memory cells 410. In one example, at least some of the memory cells 410 are similar to or identical to the memory cell 100 from FIG. 1. A number of source lines 403 and a number of data lines (406a, 406b, 406c) are shown coupled to the memory cells 410 in the memory device 400. Also shown are a number of access transistors 414 that are selected using selection lines 408. The configuration of FIG. 4 thus illustrates an example memory array that can selectively access a desired memory cell 410 to perform a memory operation, such as program, erase, read, etc.

The memory device 400 includes access transistors 414 associated with each memory cell 410. In other embodiments, no access transistors 414 are included, for example in a cross point memory cell architecture.

Figure 5:
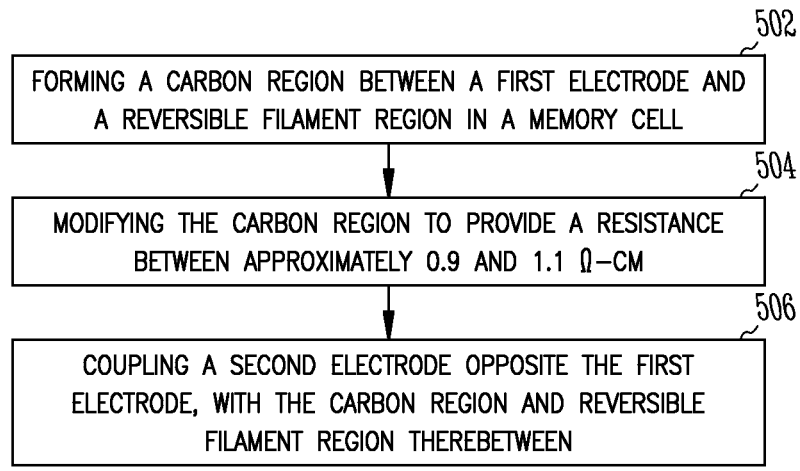
FIG. 5 shows a flow chart of a method according to an embodiment of the invention.

FIG. 5 shows a flow diagram of an example method of forming a memory cell according to an embodiment of the invention. In operation 502, a carbon region is formed between a first electrode and a reversible filament region in a memory cell. In one example, the carbon region is formed using sputter deposition techniques. In one example, the carbon region is formed using radio frequency (RF) sputter deposition techniques. In one example, the carbon region is formed using direct current (DC) sputter deposition techniques. In one example, the carbon region is sputter deposited in an atmosphere of approximately 4 mTorr of argon.

In operation 504, the carbon region is modified to provide a resistance between approximately 0.9 and 1.1 $\Omega$-cm. In operation 506, a second electrode is coupled opposite the first electrode, with the carbon region and reversible filament region disposed therebetween. In one example, the carbon region is further annealed in a temperature range of approximately 300 to 400 degrees C.

Figure 6:
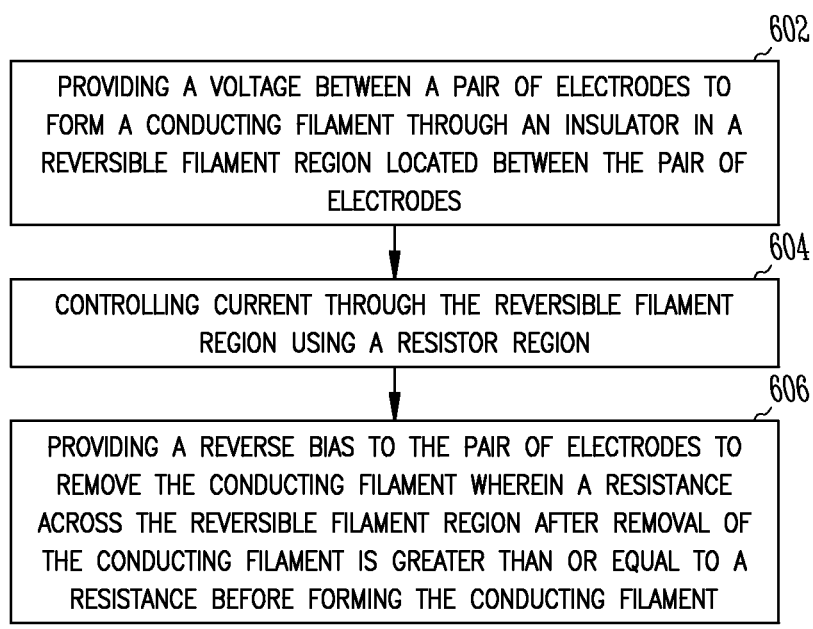
FIG. 6 shows another flow chart of a method according to an embodiment of the invention.

FIG. 6 shows a flow diagram of an example method of operation of a memory device, according to an embodiment of the invention. In operation 602, a voltage is provided across a pair of electrodes to form a conducting filament through an insulator in a reversible filament region located between the pair of electrodes. In operation 604, current is controlled through the reversible filament region using a resistor region. In operation 606, a reverse bias is provided to the pair of electrodes to remove the conducting filament, so that the resistance across the reversible filament region after removal of the conducting filament is greater than or equal to the resistance across the reversible filament region before forming the conducting filament.

Figure 7:
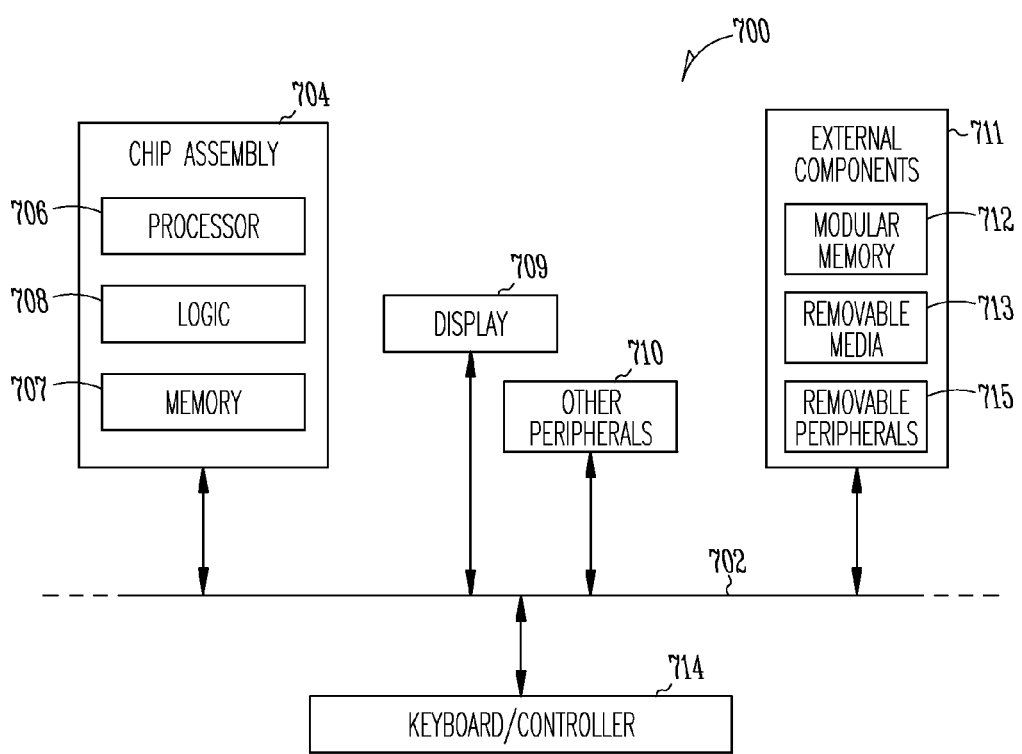
FIG. 7 is a block diagram of an apparatus, including a memory device, according to an embodiment of the invention.

FIG. 7 is a block diagram of an apparatus, including a memory device 707, according to an embodiment of the invention. The device 707 may incorporate the memory cells and/or memory devices described in embodiments above. For example, as part of the apparatus, an information handling system 700 incorporates at least one chip or chip assembly 704 that includes a memory device 707 (e.g., a device similar to or identical to the memory device 400 shown in FIG. 4) according to an embodiment of the invention. The assembly 704 may also include a processor 706 and other logic 708.

In one example, the memory device 707 includes a filamentary cell memory device such as an RRAM. The information handling system 700 shown in FIG. 7 is merely one example of a system in which embodiments of the invention can be used. Other examples include, but are not limited to, personal data assistants (PDAs), tablet computers, cameras, cellular telephones, MP3 players, aircraft, satellites, military vehicles, etc.

In this example, the information handling system 700 comprises a data processing system that includes a system bus 702 to couple the various components of the system. System bus 702 provides communications links among the various components of the information handling system 700 and may be implemented as a single bus, as a combination of busses, or in any other suitable manner.

Chip assembly 704 is coupled to the system bus 702. Chip assembly 704 may include any circuit or operably compatible combination of circuits. In one embodiment, chip assembly 704 includes a processor 706 that can be of any type. As used herein, "processor" means any type of computational circuit such as, but not limited to, a microprocessor, a microcontroller, a graphics processor, a digital signal processor (DSP), or any other type of processor or processing circuit. Multiple processors such as "multi-core" devices are also within the scope of the invention.

In one embodiment, a memory device 707, such as a memory device described in embodiments above, is included in the chip assembly 704. Those of ordinary skill in the art will recognize that a wide variety of memory device configurations may be used in the chip assembly 704. As discussed above, in selected embodiments, the memory configuration includes RRAM. In selected embodiments the memory cells are arranged in different logical configurations, such as NAND memory or NOR memory.

In one embodiment, additional logic chips 708 other than processor chips are included in the chip assembly 704. An example of a logic chip 708 other than a processor includes an analog to digital converter. Other circuits on logic chips 708 such as custom circuits, an application-specific integrated circuit (ASIC), etc. are also included in some embodiments of the invention.

Information handling system 700 may also include an external memory 711, which in turn can include one or more memory elements suitable to the particular application, such as one or more hard drives 712, and/or one or more drives that handle removable media 713 such as flash drives, compact disks (CDs), digital video disks (DVDs), and the like. The external memory 711 may include one or more memory devices 7007 manufactured according to the various embodiments described herein Information handling system 700 may also include a display device 709 such as a monitor, additional peripheral components 710, such as speakers, etc. and a keyboard and/or controller 714, which can include a mouse, a touchscreen interface, or any other device that permits a system user to input information into and receive information from the information handling system 700.

Implementing the apparatus, methods, and systems herein may provide semiconductor device designs with improved performance, including faster speed and greater reliability. Increased customer satisfaction may result.

While a number of embodiments of the invention are described, the above lists are not intended to be exhaustive. Although specific embodiments have been illustrated and described herein, it will be appreciated by those of ordinary skill in the art that any arrangement that is calculated to achieve the same purpose may be substituted for the specific embodiment shown. This application is intended to cover any adaptations or variations of the present invention. It is to be understood that the above description is intended to be illustrative and not restrictive. Combinations of the above embodiments, and other embodiments, will be apparent to those of skill in the art upon studying the above description.

What is claimed is:

1. An apparatus, comprising:
a processor;
a memory device coupled to the processor, the memory device including a number of memory cells that each include:
a reversible filament region located between a pair of electrodes, the reversible filament region including an insulator forming an interface with an oxygen source material; and
a resistor material located between the reversible filament region and at least one of the pair of electrodes.

2. The apparatus of claim 1, wherein the processor includes a multi-core processor.

3. The apparatus of claim 1, wherein the memory device is configured as a logical NAND memory.

4. The apparatus of claim 1, wherein the memory device is configured as a logical NOR memory.

5. The apparatus of claim 1, wherein the oxygen source material comprises an oxygen-containing perovskite structure material.

6. The apparatus of claim 5, wherein the resistor material includes carbon.

7. The apparatus of claim 6, wherein the resistor material includes amorphous carbon.

8. A memory device, comprising:
an array of resistive memory cells, including;
a reversible filament region located between a pair of electrodes, the reversible filament region including an insulator forming an interface with an oxygen source material;
a resistor material located between the reversible filament region and at least one of the pair of electrodes; and
a number of control lines coupled to cells in the array of resistive memory cells to perform memory operations.

9. The memory device of claim 8, wherein the number of control lines include a number of source lines.

10. The memory device of claim 9, wherein the number of control lines include a number of data lines.

11. The memory device of claim 10, wherein the number of control lines include a number of selection lines.

12. The memory device of claim 11, further including a number of access transistors associated with each memory cell.

13. The memory device of claim 8 wherein the array of memory cells are configures as cross-point memory cells.

14. The memory device of claim 8, wherein the resistor material has a resistance between approximately 0.9 and 1.1 $\Omega$-cm.

15. The memory device of claim 8, wherein the insulator is chosen from a group consisting of zirconium oxide, hafnium oxide, and hafnium silicon oxide.

16. A memory device, comprising:
an array of resistive memory cells, including;
a reversible filament region located between a pair of electrodes, the reversible filament region including an insulator forming an interface with an oxygen source material;
a carbon region separating the reversible filament region from at least one of the pair of electrodes; and
a number of control lines coupled to cells in the array of resistive memory cells to perform memory operations.

17. The memory device of claim 16, wherein the carbon region includes amorphous carbon.

18. The memory device of claim 16, wherein the insulator is zirconium oxide.

19. The memory device of claim 16, wherein the insulator is hafnium oxide.

20. The memory device of claim 16, wherein the insulator is hafnium silicon oxide.

\* \* \* \* \*